(12) United States Patent
Shim et al.

(10) Patent No.: US 12,082,448 B2
(45) Date of Patent: Sep. 3, 2024

(54) DISPLAY APPARATUS AND METHOD OF MANUFACTURING THE SAME

(71) Applicant: Samsung Display Co., Ltd., Yongin-Si (KR)

(72) Inventors: Changwoo Shim, Yongin-si (KR); Hyuntae Kim, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 350 days.

(21) Appl. No.: 17/409,882

(22) Filed: Aug. 24, 2021

(65) Prior Publication Data

US 2022/0238615 A1    Jul. 28, 2022

(30) Foreign Application Priority Data

Jan. 25, 2021    (KR) ........................ 10-2021-0010356

(51) Int. Cl.
| | | |
|---|---|---|
| *H10K 59/123* | (2023.01) | |
| *H10K 59/124* | (2023.01) | |
| *H10K 71/00* | (2023.01) | |
| *H10K 59/12* | (2023.01) | |
| *H10K 102/00* | (2023.01) | |

(52) U.S. Cl.
CPC ......... *H10K 59/123* (2023.02); *H10K 59/124* (2023.02); *H10K 71/00* (2023.02); *H10K 59/1201* (2023.02); *H10K 2102/311* (2023.02)

(58) Field of Classification Search
CPC .... H10K 59/123; H10K 59/124; H10K 71/00; H10K 59/1201; H10K 2102/311; H10K 59/1213; H10K 59/1216; H10K 50/841; H10K 59/40; H10K 59/12; H10K 59/131; H01L 27/124; H01L 27/1222; H01L 27/1248; H01L 27/1259; G09F 9/301
See application file for complete search history.

(56) References Cited

U.S. PATENT DOCUMENTS

| | | | |
|---|---|---|---|
| 7,037,779 B2 * | 5/2006 | Nakajima | ............. H01L 27/124 |
| | | | 257/E21.414 |
| 7,408,597 B2 | 8/2008 | Lee et al. | |
| 8,823,010 B2 | 9/2014 | Kim et al. | |
| 8,884,286 B2 | 11/2014 | Lee et al. | |

(Continued)

FOREIGN PATENT DOCUMENTS

| | | |
|---|---|---|
| KR | 10-1107682 B1 | 1/2012 |
| KR | 10-1333266 B1 | 11/2013 |

(Continued)

*Primary Examiner* — Kevin Quarterman
(74) *Attorney, Agent, or Firm* — Innovation Counsel LLP

(57) ABSTRACT

In order to provide a display apparatus with improved durability and improved impact resistance and a method of manufacturing the same, the disclosure provides a display apparatus and a method of manufacturing the same, the display apparatus including a substrate, a semiconductor layer disposed on the substrate, an insulating layer covering the semiconductor layer and including a first hole exposing a portion of the semiconductor layer, a first conductive layer disposed on the insulating layer and including a second hole overlapping the first hole, and a second conductive layer in contact with the portion of the semiconductor layer via the first hole and the second hole.

13 Claims, 17 Drawing Sheets

(56) References Cited

U.S. PATENT DOCUMENTS

| | | | |
|---|---|---|---|
| 2006/0175648 A1* | 8/2006 | Asami | H01L 27/1214 |
| | | | 257/E27.113 |
| 2014/0038351 A1* | 2/2014 | Yamazaki | H01L 29/518 |
| | | | 438/104 |
| 2019/0172851 A1* | 6/2019 | Yamayoshi | H01L 27/1248 |
| 2021/0257435 A1* | 8/2021 | Kim | H10K 59/353 |

FOREIGN PATENT DOCUMENTS

| | | |
|---|---|---|
| KR | 10-2014-0067600 A | 6/2014 |
| KR | 10-1715848 B1 | 3/2017 |

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0010356, filed on Jan. 25, 2021, in the Korean Intellectual Property Office, the disclosure of which is incorporated by reference herein in its entirety.

BACKGROUND

1. Field

The disclosure relates to a display apparatus and a method of manufacturing the same, and more particularly, to a display apparatus with improved durability and improved impact resistance, and a method of manufacturing the same.

2. Description of the Related Art

Mobile electronic devices are widely used. As mobile electronic devices, tablet PCs have been widely used in recent years in addition to small electronic devices such as mobile phones.

Such mobile electronic devices include display apparatuses that provide a user with various functions, for example, visual information such as images or pictures. Recently, as other components for driving a display apparatus have been miniaturized, the proportion of a display apparatus in an electronic device is gradually increasing, and development of a display apparatus of which the shape may be changed in various ways, for example, that may be bent or folded, is ongoing.

SUMMARY

In a case of foldable display apparatuses, the strength of modules provided in a display apparatus in order to implement foldable characteristics such as a cover window may be slightly weaker than that disposed on the display panel DP which is not a foldable display, and thus the display apparatus may be further vulnerable to external impact.

The disclosure is to solve various problems including the above problems, and thus provided are a display apparatus with improved durability and improved impact resistance and a method of manufacturing the same. However, one or more embodiments are only examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus includes a substrate, a semiconductor layer disposed on the substrate, an insulating layer covering the semiconductor layer and including a first hole exposing a portion of the semiconductor layer, a first conductive layer disposed on the insulating layer and including a second hole overlapping the first hole, and a second conductive layer in contact with the portion of the semiconductor layer via the first hole and the second hole.

The display apparatus may further include a planarization layer covering the second conductive layer, a pixel electrode disposed on the planarization layer and electrically connected to a portion of the second conductive layer, an opposite electrode overlapping the pixel electrode, and an emission layer disposed between the pixel electrode and the opposite electrode.

The planarization layer may include an organic insulating material.

The first conductive layer may be in direct contact with the second conductive layer.

The semiconductor layer may include a channel area, a drain area, and a source area. The second conductive layer may contact the drain area or the source area.

The display apparatus may further include a wire disposed on the insulating layer and including a same material as that of the second conductive layer.

The insulating layer may include an inorganic insulating material.

The display apparatus may further include an organic protective layer disposed between the first conductive layer and the second conductive layer.

The organic protective layer may include a third hole exposing part of the first conductive layer.

The third hole of the organic protective layer may overlap the first hole of the insulating layer.

A width of the third hole of the organic protective layer may be greater than a width of the first hole of the insulating layer.

The second conductive layer may be in direct contact with the first conductive layer via the third hole.

The display apparatus may further include a planarization layer disposed on the organic protective layer and covering the second conductive layer, a pixel electrode disposed on the planarization layer and electrically connected to a portion of the second conductive layer, an opposite electrode overlapping the pixel electrode, and an emission layer disposed between the pixel electrode and the opposite electrode.

According to one or more embodiments, a method of manufacturing a display apparatus includes forming a semiconductor layer on a substrate, forming an insulating layer covering the semiconductor layer, forming a first conductive layer on the insulating layer to overlap the semiconductor layer in a plan view, forming a first hole and a second hole in the insulating layer and the first conductive layer, respectively, by using one mask, to overlap the semiconductor layer in a plan view, and forming a second conductive layer connected to the semiconductor layer via the first hole and the second hole.

The method may further include forming a planarization layer covering the second conductive layer, forming a pixel electrode on the planarization layer and electrically connected to the second conductive layer, forming a pixel-defining layer on the pixel electrode and including an opening that exposes at least part of the pixel electrode, forming an emission layer in the opening of the pixel-defining layer and corresponding to the pixel electrode, and forming an opposite electrode on the emission layer.

The first conductive layer may be in direct contact with the second conductive layer.

The method may further include forming an organic protective layer between the first conductive layer and the second conductive layer.

The forming of the organic protective layer may further include forming an organic protective layer material on the first conductive layer, and forming a third hole overlapping the first hole and the second hole in the organic protective layer material in a plan view.

The third hole may have a greater width than a width of the second hole such that a portion of the first conductive layer is exposed.

At least a portion of the second conductive layer may be formed to correspond to the first to third holes.

These and/or other aspects, features, and advantages will become apparent from the following detailed description of the embodiments, the claims, and the accompanying drawings.

These general and specific aspects can be implemented using systems, methods, computer programs, or any combination of systems, methods, and computer programs.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1A:
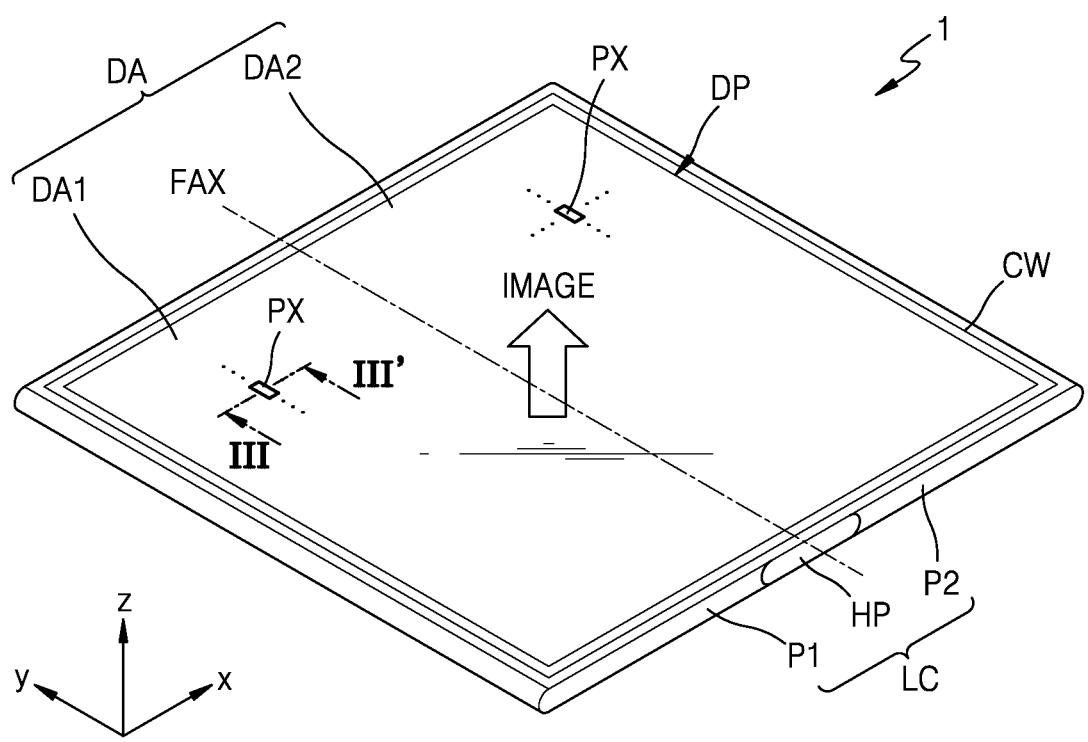
FIGS. 1A and 1B are each a schematic perspective view of a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, embodiments are illustrated in the drawings and are described in the detailed description. An effect and a characteristic of the disclosure, and a method of accomplishing them will be apparent when referring to embodiments described with reference to the drawings. However, the disclosure is not limited to the embodiments described below, but may be implemented in various forms.

Hereinafter, embodiments of the disclosure will be described in detail with reference to the accompanying drawings, the same reference numerals are used to denote the same elements, and duplicate descriptions thereof will be omitted.

It will be understood that although the terms "first," "second," etc. may be used herein to describe various elements, these elements should not be limited by these terms. These elements are only used to distinguish one element from another.

An expression used in the singular encompasses the expression of the plural unless it has a clearly different meaning in the context.

It will be further understood that the terms "comprises" and/or "comprising" used herein specify the presence of stated features or constituent elements, but do not preclude the presence or addition of one or more other features or constituent elements.

It will be understood that when a layer, area, or constituent element is referred to as being "formed on" another layer, area, or element, it can be directly or indirectly formed on the other layer, area, or constituent element. That is, for example, intervening layers, areas, or constituent elements may be present.

When a certain embodiment may be implemented differently, a specific process order may be performed differently from the described order. For example, two consecutively described processes may be performed substantially at the same time or performed in an order opposite to the described order.

In the present specification, the expression "A and/or B" represents A, B, or A and B. In addition, the expression "at least one of A and B" represents A, B, or A and B.

It will be understood that when a layer, area, or constituent element is referred to as being "connected to" another layer, area, or constituent element, it can be directly or indirectly connected to the other layer, area, or constituent element. That is, for example, intervening layers, areas, or constituent elements may be present. For example, it will be understood that when a layer, area, or element is referred to as being "electrically connected to" another layer, area, or element, it can be directly or indirectly electrically connected to the other layer, area, or element. That is, for example, intervening layers, areas, or elements may be present.

The x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
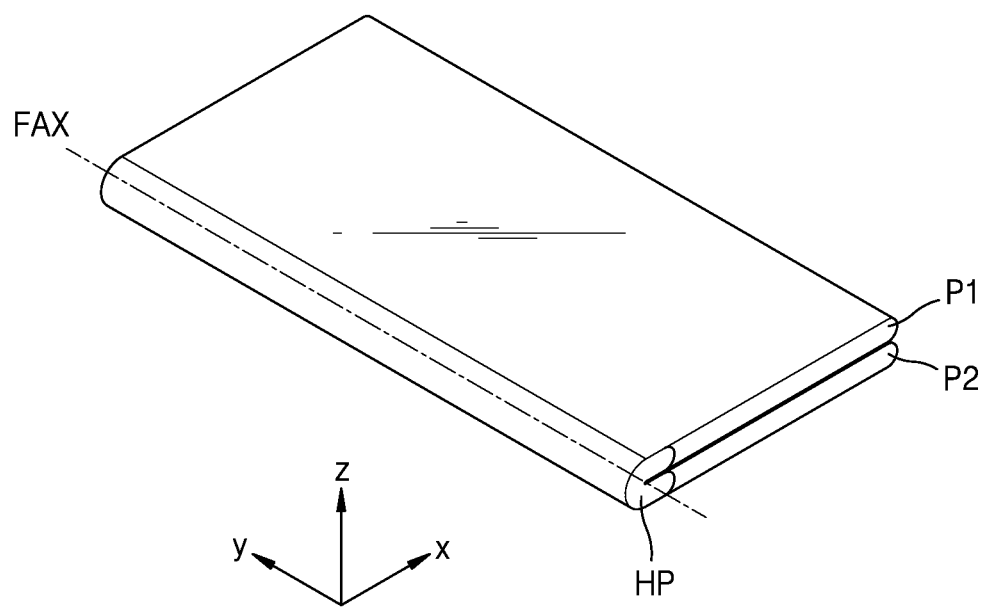

FIGS. 1A and 1B are each a schematic perspective view of a display apparatus, according to an embodiment. FIG. 1A illustrates a state in which a display apparatus is unfolded, and FIG. 1B illustrates a state in which the display apparatus is folded.

Referring to FIGS. 1A and 1B, a display apparatus 1 may include a lower cover LC, a display panel DP, and a cover window CW.

The lower cover LC may include a first portion P1 and a second portion P2 supporting the display panel DP. The lower cover LC may be folded with respect to a folding axis FAX disposed between the first portion P1 and the second portion P2. In an embodiment, the lower cover LC may include a hinge portion HP disposed between the first portion P1 and the second portion P2.

The display panel DP may include a display area DA. The display panel DP may provide an image via an array of a plurality of pixels PX arranged in the display area DA. A pixel PX may be defined as an emission area in which light is emitted by a light-emitting element electrically connected to a pixel circuit. The light-emitting element may be, for example, an organic light-emitting diode (OLED). The plurality of pixels PX may each emit red, green, or blue light.

Alternatively, in another embodiment, the plurality of pixels PX may each emit red, green, blue, or white light.

The display area DA may include a first display area DA1 and a second display area DA2 at both sides of the display area DA with respect to the folding axis FAX crossing the display area DA. The first display area DA1 and the second display area DA2 may be located on the first portion P1 and the second portion P2 of the lower cover LC, respectively. The display panel DP may provide first and second images by using light emitted from the plurality of pixels PX respectively located in the first and second display areas DA1 and DA2. In some embodiments, the first to second images may be portions of an image provided via the display area DA of the display panel DP. In addition, in some embodiments, the display panel DP may provide the first and second images that are independent from each other.

The display panel DP may be folded with respect to the folding axis FAX. In a case where the display panel DP is folded, the first display area DA1 and the second display area DA2 of the display panel DP may face each other.

FIGS. 1A and 1B illustrate a case in which the folding axis FAX extends in a y direction, but in another embodiment, the folding axis FAX may extend in an x direction. In another embodiment, the folding axis FAX on an xy-plane may also extend in a direction in which the x direction and the y direction intersect with each other. Also, although FIGS. 1A and 1B illustrate a case where there is one folding axis FAX, in another embodiment, the display panel DP may be folded in plural times with respect to a plurality of folding axis FAX crossing the display area DA.

The cover window CW is located on the display panel DP and may cover the display panel DP. The cover window CW may be folded or bent without occurrence of a crack or the like. When the display panel DP is folded with respect to the folding axis FAX, the cover window CW may also be folded and the display panel DP may be covered by the cover window CW.

Figure 2:
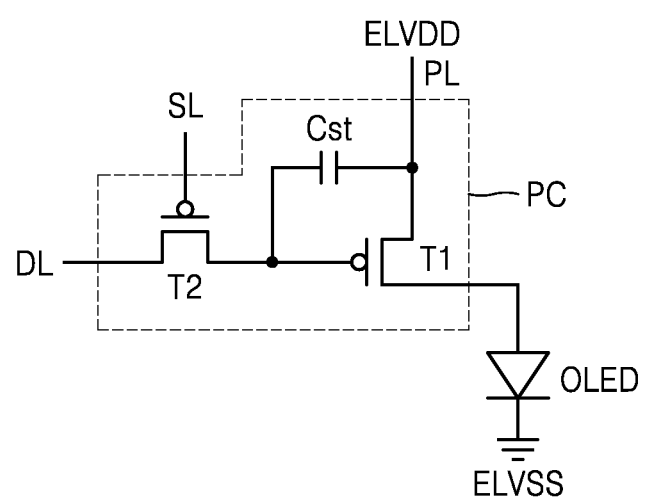
FIG. 2 is an equivalent circuit diagram of a pixel circuit included in an embodiment.

FIG. 2 is an equivalent circuit diagram of a pixel circuit included in a pixel.

Referring to FIG. 2, a pixel circuit PC may include a plurality of thin-film transistors and a storage capacitor, and may be electrically connected to an organic light-emitting diode (OLED). In an embodiment, the pixel circuit PC may include a driving thin-film transistor T1, a switching thin-film transistor T2, and a storage capacitor Cst.

The switching thin-film transistor T2 is connected to a scan line SL and a data line DL, and may be configured to transmit a data signal or data voltage input from the data line DL to the driving thin-film transistor T1 in response to a scan signal or switching voltage input from the scan line SL. The storage capacitor Cst is connected to the switching thin-film transistor T2 and a driving voltage line PL, and may store a voltage corresponding to a difference between a voltage received from the switching thin-film transistor T2 and a first power voltage ELVDD applied to the driving voltage line PL.

The driving thin-film transistor T1 is connected to the driving voltage line PL and the storage capacitor Cst, and may control a driving current flowing from the driving voltage line PL to an organic light-emitting diode OLED in response to a voltage value stored in the storage capacitor Cst. An opposite electrode (for example, a cathode) of the organic light-emitting diode OLED may receive a second power voltage ELVSS. The organic light-emitting diode OLED may emit light having a certain luminance according to the driving voltage.

Although a case where the pixel circuit PC includes two thin-film transistors and one storage capacitor is described, embodiments are not limited thereto. For example, the pixel circuit PC may include at least three thin-film transistors and/or at least two storage capacitors. In an embodiment, the pixel circuit PC may include seven thin-film transistors and one storage capacitor. The numbers of thin-film transistors and storage capacitors may be variously changed according to a design of the pixel circuit PC. However, hereinafter, for convenience of description, a case where the pixel circuit PC includes two thin-film transistors and one storage capacitor will be described.

Figure 3:
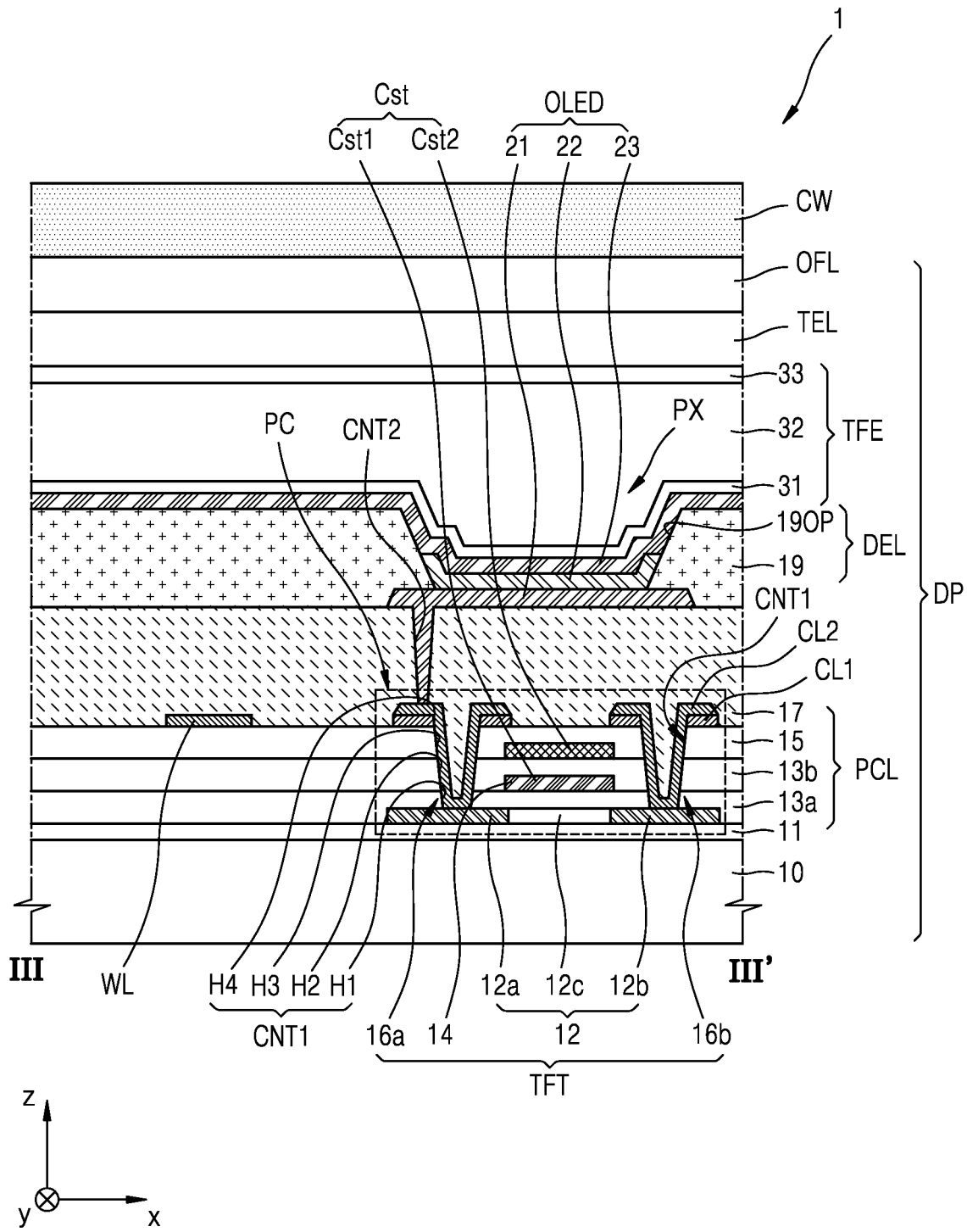
FIG. 3 is a schematic cross-sectional view of part of a display apparatus, according to an embodiment.

FIG. 3 is a schematic cross-sectional view of part of a display apparatus, according to an embodiment. FIG. 3 may correspond to a cross section of a display apparatus taken along a line III-III' of FIG. 1A.

Referring to FIG. 3, the display apparatus 1 may include the display panel DP and the cover window CW disposed on the display panel DP. The display panel DP may include a stacked structure of a substrate 10, a pixel circuit layer PCL, a display element layer DEL, a thin-film encapsulation layer TFE, a touch electrode layer TEL, and an optical functional layer OFL.

The substrate 10 may include a glass material or a polymer resin. In this regard, the polymer resin may include, for example, polyethersulfone, polyarylate, polyetherimide, polyethylene naphthalate, polyethylene terephthalate, polyphenylene sulfide, polyimide, polycarbonate, cellulose triacetate, cellulose acetate propionate, and the like. The substrate 10 including the polymer resin may have flexible, rollable, or bendable characteristics. The substrate 10 may have a multi-layered structure including a layer including the aforementioned polymer resin and an organic layer (not shown).

The pixel circuit layer PCL may be located on the substrate 10. In an embodiment, the pixel circuit layer PCL may include the pixel circuit PC including thin-film transistors TFT and the storage capacitor Cst, and a buffer layer 11, a first gate insulating layer 13a, a second gate insulating layer 13b, an insulating interlayer 15, and a planarization layer 17, each located under, on, or between and constituent elements of the pixel circuit PC.

The buffer layer 11 may reduce or block foreign substances, moisture, or external air, each penetrating from a lower portion of the substrate 10, and may provide a flat surface on the substrate 10. The buffer layer 11 may include an inorganic insulating material such as silicon nitride, silicon oxynitride, and silicon oxide, and may include a single layer or a multilayer, each including the aforementioned inorganic insulating material.

A thin-film transistor TFT disposed on the buffer layer 11 may include a semiconductor layer 12, and the semiconductor layer 12 may include polysilicon. Alternatively, the semiconductor layer 12 may include amorphous silicon, an oxide semiconductor, or an organic semiconductor. The semiconductor layer 12 may include a channel area $12c$, and a drain area $12a$ and a source area $12b$ respectively located at both sides of the channel area $12c$.

A gate electrode 14 may overlap the channel area $12c$. The gate electrode 14 may include a low-resistance metal material. The gate electrode 14 may include a conductive material including molybdenum (Mo), aluminum (Al), copper (Cu), titanium (Ti), or the like, and may include a multilayer or a single layer, each including the material.

The first gate insulating layer $13a$ disposed between the semiconductor layer 12 and the gate electrode 14 may include an inorganic insulating material such as silicon oxide (SiO$_2$), silicon nitride (SiN$_X$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), or the like.

The second gate insulating layer 13b may cover the gate electrode 14. Similar to the first gate insulating layer 13a, the second gate insulating layer 13b may include an inorganic insulating material such as silicon oxide (SiO$_2$), silicon nitride (SiN$_X$), silicon oxynitride (SiON), aluminum oxide (Al$_2$O$_3$), titanium oxide (TiO$_2$), tantalum oxide (Ta$_2$O$_5$), hafnium oxide (HfO$_2$), zinc oxide (ZnO), or the like.

An upper electrode Cst2 of the storage capacitor Cst may be disposed on the second gate insulating layer 13b. The upper electrode Cst2 may overlap the gate electrode 14 disposed thereunder. In this regard, the gate electrode 14 and the upper electrode Cst2, which overlap each other with the second gate insulating layer 13b disposed therebetween, may form the storage capacitor Cst. That is, the gate electrode 14 may function as a lower electrode Cst1 of the storage capacitor Cst.

Thus, the storage capacitor Cst and the thin-film transistor TFT may be formed to overlap each other. In some embodiments, the storage capacitor Cst may be formed not to overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multilayer of the aforementioned material.

The insulating interlayer 15 may cover the upper electrode Cst2. The insulating interlayer 15 may include an inorganic insulation material such as silicon oxide (SiO$_2$), silicon nitride (SiN$_X$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). The insulating interlayer 15 may include a single layer or a multilayer, each including the aforementioned inorganic insulation material.

Insulating layers, that is, the first gate insulating layer 13a, the second gate insulating layer 13b, and the insulating interlayer 15, may include a first hole H1, a second hole H2, and a third hole H3, respectively. The first to third holes H1, H2, and H3 are through holes that overlap one another, and may form one contact hole as described below. The first to third holes H1, H2, and H3 may exposed a portion of the semiconductor layer 12, and the portion of the semiconductor layer 12 may include the drain area 12a or the source area 12b. That is, the first to third holes H1, H2, and H3 may be located to correspond to the drain area 12a or the source area 12b of the semiconductor layer 12.

A first conductive layer CL1 may be disposed on the insulating interlayer 15. The first conductive layer CL1 may be formed to completely surround the first to third holes H1, H2, and H3 in a plan view. The first conductive layer CL1 includes a fourth hole H4, and the fourth hole H4 may be a through hole that overlaps the first to third holes H1, H2, and H3 in a plan view. The fourth hole H4 may form a first contact hole CNT1 along with the first to third holes H1, H2, and H3.

The second conductive layer CL2 may be disposed on the first conductive layer CL1. In an embodiment, as shown in FIG. 3, the second conductive layer CL2 may be in direct contact with the first conductive layer CL1. At least a portion of the second conductive layer CL2 may be disposed to overlap the first contact hole CNT1 formed by the first to fourth holes H1, H2, H3, and H4. A portion of the second conductive layer CL2 may be in direct contact with a portion of the semiconductor layer 12 via the first contact hole CNT1. For example, a portion of the second conductive layer CL2 may be in direct contact with the drain area 12a or the source area 12b via the first contact hole CNT1. A portion of the second conductive layer CL2, which is in direct contact with the drain area 12a, may function as a drain electrode 16a, and a portion of the second conductive layer CL2, which is in direct contact with the source area 12b, may function as a source electrode 16b.

The first conductive layer CL1 and the second conductive layer CL2 may include a material with excellent conductivity. The first conductive layer CL1 and the second conductive layer CL2 may include a conductive material including molybdenum (Mo), aluminum (Al), copper (Cu), titanium (Ti), or the like. For example, the first conductive layer CL1 and the second conductive layer CL2 may be formed of different materials from each other via different processes from each other. As another example, the first conductive layer CL1 and the second conductive layer CL2 may be formed of the same material as each other, but may be formed via different processes from each other.

In a case where a large external impact is applied to the display apparatus 1, damage such as a crack or the like may occur in the display panel DP provided in the display apparatus 1. Such damage may cause a defect such as a bright spot or a dark spot in the display panel DP, and is likely to occur around a contact hole. Especially, in a case of foldable display apparatuses, the strength of the cover window CW disposed on the display panel DP or the like in order to implement foldable characteristics may be slightly weaker than that disposed on the display panel DP which is not a foldable display, and thus the display panel DP may be further vulnerable to external impact.

As a comparative example, in a case where the first conductive layer CL1 is not provided in the display panel DP, only the second conductive layer CL2 is disposed around the first contact hole CNT1. In a process of forming the second conductive layer CL2 on the insulating interlayer 15, the second conductive layer CL2 may be shifted to one side due to a mis-alignment. As a result, the second conductive layer CL2 may not entirely cover the first contact hole CNT1 and may only cover a partial area of the first contact hole CNT1. Even in this case, once the second conductive layer CL2 is connected to the semiconductor layer 12 disposed thereunder, the contact structure may not be functionally defective. However, a partial area of the first contact hole CNT1, which is exposed by the second conductive layer CL2 without overlapping, is vulnerable to external impact, and damage such as a crack or the like is likely to occur.

According to an embodiment, the display apparatus 1 may include a first conductive layer CL1 disposed below the second conductive layer CL2 which is connected to the semiconductor layer 12 via the first contact hole CNT1. The first conductive layer CL1 is disposed around the first contact hole CNT1 and may include a metal material with relatively higher strength than insulating layers forming the first contact hole CNT1. Even if the second conductive layer CL2 is shifted to one side due to the mis-alignment, the first conductive layer CL1 is formed around the first contact hole CNT1 and thus a possibility of occurrence of damage such as a crack or the like around the first contact hole CNT1 may be minimized. Accordingly, durability and impact resistance of the display panel DP provided in the display apparatus 1 may be improved.

In addition, a wire WL may be disposed on the insulating interlayer 15. Although not shown, the wire WL is electrically connected to the pixel circuit PC, and may apply an electrical signal or power to the pixel circuit PC. For example, the wire WL may be the data line DL (see FIG. 2), the driving voltage line PL (see FIG. 2), or the scan line SL (see FIG. 2).

In an embodiment, as shown in FIG. 3, the wire WL is formed via the same process as used to form the second conductive layer CL2, and may include the same material as that of the second conductive layer CL2. That is, the second conductive layer CL2 may include the wire WL. Although not shown, in a case where the wire WL is connected to a conductive layer disposed thereunder, the aforementioned contact structure may be employed. For example, in a case where the conductive layer is part of the semiconductor layer 12, the first conductive layer CL1 is provided between the wire WL and the insulating interlayer 15, and the wire WL may be connected to the conductive layer via a contact hole formed by holes respectively formed in the first conductive layer CL1, the insulating interlayer 15, the second gate insulating layer 13b, and the first gate insulating layer 13a.

In another embodiment, the wire WL may be formed via the same process as used to form the first conductive layer CL1, and may include the same material as that of the first conductive layer CL1. That is, the first conductive layer CL1 may include the wire WL.

The planarization layer 17 covering the second conductive layer CL2 may be disposed on the insulating interlayer 15. The planarization layer 17 may include an organic insulating layer. The planarization layer 17 may include an organic insulating material such as general-purpose polymer such as polymethylmethacrylate (PMMA) or polystyrene (PS), polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

The display element layer DEL is disposed on the pixel circuit layer PCL having the aforementioned structure. The display element layer DEL includes the organic light-emitting diode OLED as a light-emitting element, and the organic light-emitting diode OLED may include a stacked structure of a pixel electrode 21, an emission layer 22, and an opposite electrode 23. The pixel electrode 21 of the organic light-emitting diode OLED may be electrically connected to the thin-film transistor TFT via a second contact hole CNT2 formed in the planarization layer 17.

The pixel electrode 21 may include a conductive oxide material such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 21 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 21 may further include a film formed of ITO, IZO, ZnO, or $In_2O_3$ on/under the reflective film.

A pixel-defining layer 19 having an opening 190P that exposes a central portion of the pixel electrode 21 is disposed on the pixel electrode 21. The pixel-defining layer 19 may include an organic insulating material and/or an inorganic insulating material. The opening 190P may define an emission area of light emitted from the organic light-emitting diode OLED. For example, a size/width of the opening 190P may correspond to a size/width of the emission area. Accordingly, a size and/or a width of the pixel PX may depend on a size and/or a width of the opening 190P of the pixel-defining layer 19.

The emission layer 22 may be disposed on the opening 190P of the pixel-defining layer 19. The emission layer 22 may include a polymer or a small molecule organic material, each emitting light having a certain color. Alternatively, the emission layer 22 may include an inorganic light-emitting material or may include a quantum dot.

Although not shown, a first functional layer and a second functional layer may be disposed under the emission layer 22 and on the emission layer 22, respectively. The first functional layer may include, for example, a hole transport layer r, or may include, for example, a hole transport layer and a hole injection layer. The second functional layer is a constituent element disposed on the emission layer 22 and is optional. The second functional layer may include an electron transport layer and/or an electron injection layer. The first functional layer and/or the second functional layer may be a common layer that is formed to entirely cover the substrate 10 as with the opposite electrode 23.

The opposite electrode 23 is disposed on the pixel electrode 21 and may overlap the pixel electrode 21. The opposite electrode 23 may include a conductive material having a low work function. For example, the opposite electrode 23 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the opposite electrode 23 may further include a layer such as ITO, IZO, ZnO, or $In_2O_3$ on the (semi)transparent layer including the aforementioned material. The opposite electrode 23 may be integrally formed to entirely cover the substrate 10.

The thin-film encapsulation layer TFE may be disposed on the display element layer DEL and may cover the display element layer DEL. The thin-film encapsulation layer TFE includes at least one inorganic encapsulation layer and at least one organic encapsulation layer, and as an embodiment, FIG. 3 illustrates that the thin-film encapsulation layer TFE includes a first inorganic encapsulation layer 31, an organic encapsulation layer 32, and a second inorganic encapsulation layer 33 which are sequentially stacked in this stated order.

The first inorganic encapsulation layer 31 and the second inorganic encapsulation layer 33 may include at least one inorganic material among aluminum oxide, titanium oxide, tantalum oxide, hafnium oxide, zinc oxide, silicon oxide, silicon nitride, and silicon oxynitride. The organic encapsulation layer 32 may include a polymer-based material. The polymer-based material may include an acryl-based resin, an epoxy-based resin, polyimide, polyethylene, and the like. In an embodiment, the organic encapsulation layer 32 may include acrylate. The organic encapsulation layer 32 may be formed by hardening a monomer or applying a polymer. The organic encapsulation layer 32 may have transparency.

The touch electrode layer TEL including touch electrodes may be disposed on the thin-film encapsulation layer TFE, and the optical functional layer OFL may be disposed on the touch electrode layer TEL. The touch electrode layer TEL may obtain coordinate information in response to an external input, for example, a touch event. The optical functional layer OFL may reduce the reflectance of light (external light) incident on the display apparatus 1, and/or may improve the color purity of light emitted from the display apparatus 1.

In an embodiment, the optical functional layer OFL may include a retarder and a polarizer. The retarder may be of a film type or a liquid crystal coating type and may include a λ/2 retarder and/or a λ/4 retarder. The polarizer may also be of a film type or a liquid crystal coating type. The film type may include a stretch-type synthetic resin film, and the liquid crystal coating type may include liquid crystals arranged in a certain arrangement. The retarder and the polarizer may further include a protective film.

In an embodiment, the optical functional layer OFL may include a destructive interference structure. The destructive interference structure may include a first reflective layer and a second reflective layer which are located on different layers. First reflected light and second reflected light respectively reflected by the first reflective layer and the second reflective layer may destructively interfere with each other, and thus external light reflectance may be reduced.

An adhesive member may be disposed between the touch electrode layer TEL and the optical functional layer OFL. The adhesive member may be any adhesive member generally known in the related art. The adhesive member may be a pressure sensitive adhesive (PSA).

The cover window CW may be disposed on the display panel DP. The cover window CW may be attached to the display panel DP by an adhesive member. The adhesive member may be, for example, a PSA.

The cover window CW may have a high transmittance to transmit light emitted from the display panel DP and may have a thin thickness to minimize the weight of the display apparatus 1. In addition, the cover window CW may have significant strength and rigidity to protect the display panel DP or the like from external impact. The cover window CW may include, for example, glass or plastic. In an embodiment, the cover window CW may be an ultra-thin film tempered glass which is strengthened by a method such as chemical strengthening or thermal strengthening.

So far, although it has been described that the display apparatus 1 includes the organic light-emitting diode OLED as a light-emitting element, the display apparatus 1 of the disclosure is not limited thereto. In another embodiment, the display apparatus 1 may be a light-emitting display apparatus including an inorganic light-emitting diode. The inorganic light-emitting diode may include a PN junction diode including inorganic semiconductor-based materials. When a voltage is applied to the PN junction diode in a forward direction, a hole and an electron are injected, energy generated in recombination of the hole and the electron is converted to light energy such that light having a certain color may be emitted. The aforementioned inorganic light-emitting diode may have a width of several micrometres to several hundred micrometres, and in some embodiments, the inorganic light-emitting diode may be referred to as a micro LED.

Also, the stacked structure of the display apparatus 1 described so far is not limited to a foldable display apparatus, and a non-foldable display apparatus may be applied to a rollable display apparatus or the like.

FIGS. 4A to 4E are schematic cross-sectional views showing a method of manufacturing a display apparatus according to an embodiment.

Figure 4A:
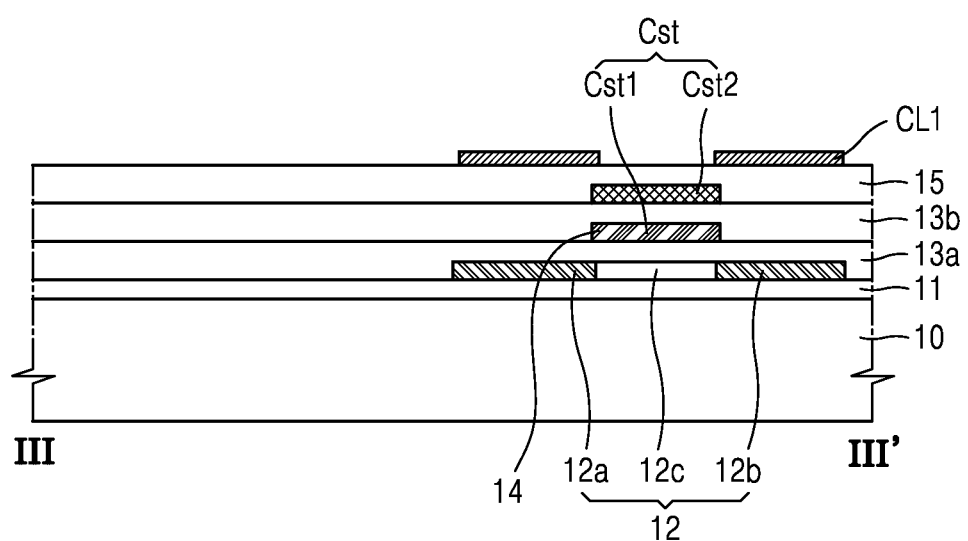
FIGS. 4A, 4B, 4C, 4D and 4E are schematic cross-sectional views showing a method of manufacturing a display apparatus, according to an embodiment.
Figure 4A:
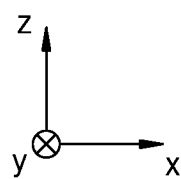

Referring to FIG. 4A, the substrate 10 is prepared, and the buffer layer 11 may be formed on the substrate 10. The buffer layer 11 may be formed by a vapor deposition method, for example, chemical vapor deposition (CVD), thermal chemical vapor deposition (TCVD), plasma enhanced chemical vapor deposition (PECVD), sputtering, electron-beam evaporation, or the like.

Next, the semiconductor layer 12 may be formed on the buffer layer 11. The semiconductor layer 12 may be formed via a vapor deposition process, a photolithography process, and a doping process. In detail, a semiconductor layer material is formed on the buffer layer 11 via the aforementioned vapor deposition method, and a photoresist is formed on the semiconductor layer material. In this regard, the photoresist may be of positive or negative. Afterwards, a photoresist pattern may be formed by exposing and developing the photoresist via a mask having a certain pattern. After a pattern is formed by etching the semiconductor layer material by using the photoresist pattern as an etching mask, the photoresist pattern may be removed.

Next, the first gate insulating layer 13a, the gate electrode 14, the second gate insulating layer 13b, the upper electrode Cst2 of the storage capacitor Cst, and the insulating interlayer 15 may be sequentially formed on the semiconductor layer 12. Similar to a method used to form the aforementioned buffer layer 11, the first gate insulating layer 13a, the second gate insulating layer 13b, and the insulating interlayer 15 may be formed via a vapor deposition method such as CVD, TCVD, PECVD, sputtering, electron-beam evaporation, or the like. The gate electrode 14 and the upper electrode Cst2 may be formed via a vapor deposition process and a photolithography process. In some embodiments, a drain area 12a and a source area 12b may be formed by doping impurities into the semiconductor layer 12 using the patterned gate electrode 14 as a mask.

Figure 4B:
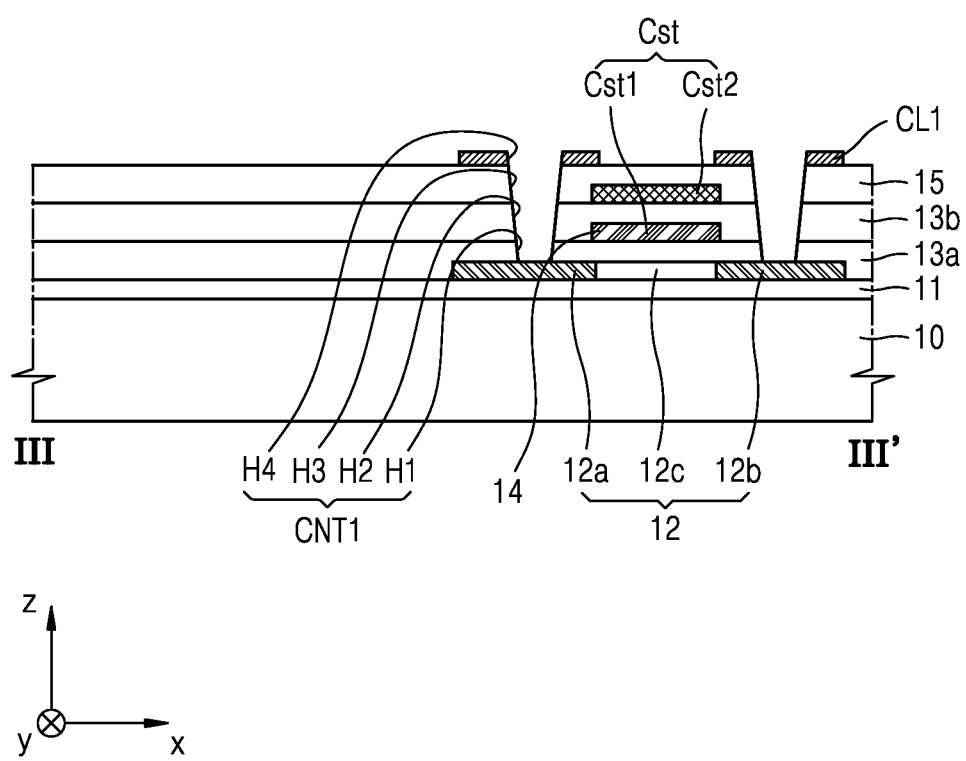

Next, the first conductive layer CL1 may be formed on the insulating interlayer 15. For example, after a first conductive layer material is formed on the insulating interlayer 15 via a vapor deposition method such as CVD, TCVD, PECVD, sputtering, electron-beam evaporation, or the like. The first conductive layer CL1 may be formed by patterning the first conductive layer material via a photolithography process. The first conductive layer CL1 may be formed in areas correspond to the drain area 12a and the source area 12b of the semiconductor layer 12 in a plan view. In some embodiments, The first conductive layer CL1 may cover major portion of the drain area 12a and the source area 12b of the semiconductor layer 12 in a plan view. For example, the first conductive layer CL1 may completely cover the drain area 12a and the source area 12b of the semiconductor layer 12 in a plan view. The first conductive layer CL1 may partially overlap the gate electrode 14 (a lower electrode Cst1 of the storage capacitor Cst) and the upper electrode Cst2 of the storage capacitor Cst in a plan view. Referring to FIG. 4B, the first to fourth holes H1, H2, H3, and H4 overlapping each other may be formed in the first gate insulating layer 13a, the second gate insulating layer 13b, the insulating interlayer 15, and the first conductive layer CL1, respectively. The first to fourth holes H1, H2, H3, and H4 may form the first contact hole CNT1. According to an embodiment, one mask may be used to form the first to fourth holes H1, H2, H3, and H4.

In detail, as shown in FIG. 4A, in a state where the first conductive layer CL1 is formed on the insulating interlayer 15, a photoresist may be coated on the first conductive layer CL1. Afterwards, a photoresist pattern may be formed by exposing and developing the photoresist via a mask having a certain pattern. The fourth hole H4 may be formed by etching the first conductive layer CL1 by using the photoresist pattern as an etching mask. Next, the insulating interlayer 15, the second gate insulating layer 13b, and the first gate insulating layer 13a may be sequentially etched by using the photoresist pattern as an etching mask again. In this regard, the etching may be an anisotropic etching, for example, reactive ion etching (RIE). Accordingly, the third hole H3, the second hole H2, and the first hole H1 may be sequentially formed. In some embodiments, in a case where the insulating interlayer 15, the second gate insulating layer 13b, and the first gate insulating layer 13a include the same inorganic insulating layer, the third hole H3, the second hole H2, and the first hole H1 may be formed using in-situ etching process.

As a comparative example, the first to fourth holes H1, H2, H3, and H4 may be formed with at least two masks. For example, when the first to third holes H1, H2, and H3 are formed with a first mask and the fourth hole H4 is formed with a second mask, a mis-alignment between the first to third holes H1, H2, and H3 and the fourth hole H4 may increase. This is because a pattern of the first mask and a pattern of the second mask may not be exactly matched and an alignment error between the first mask and the second mask or the like may occur. Accordingly, in this case, a design margin required for formation of the first to fourth holes H1, H2, H3, and H4 increases, which may cause a decrease in the degree of integration of the display panel DP.

However, according to an embodiment described above, the mis-alignment between the first to fourth holes H1, H2, H3, and H4 overlapping each other may be minimized by forming the first to fourth holes H1, H2, H3, and H4 by using one mask. In addition, it is possible to minimize process restrictions such as reducing a design margin required for formation of the first to fourth holes H1, H2, H3, and H4 and prevent a decrease in the degree of integration of the display panel DP.

Figure 4C:
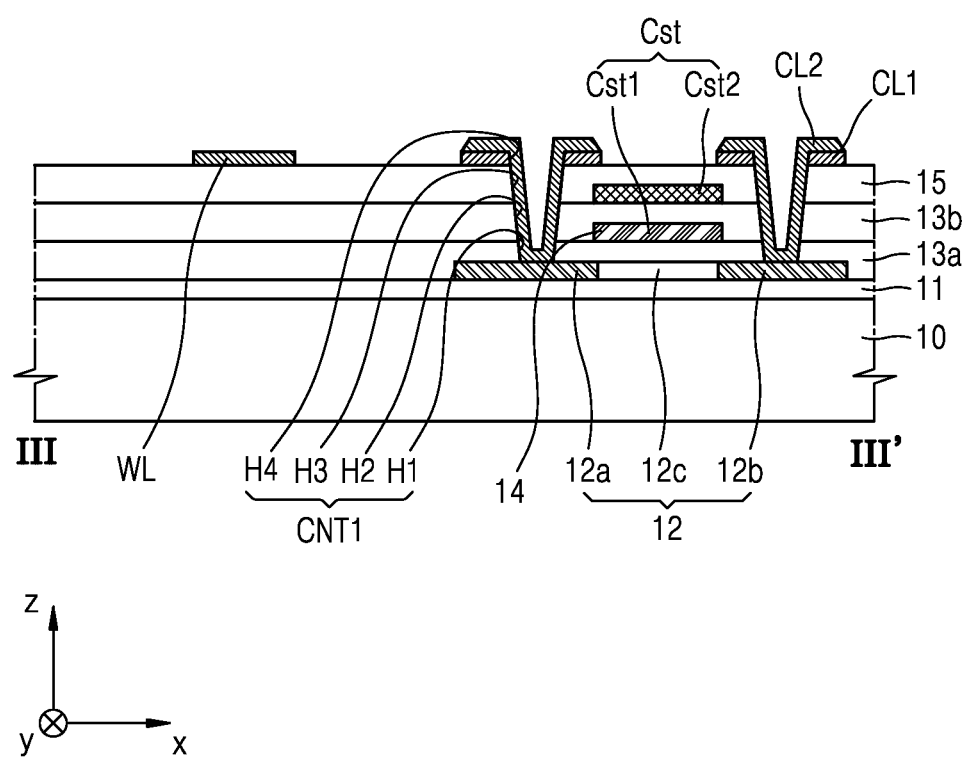

Referring to FIG. 4C, the second conductive layer CL2 may be formed. The second conductive layer CL2 may be disposed on the first conductive layer CL1 and may be in direct contact with the first conductive layer CL1. The second conductive layer CL2 may be connected to the semiconductor layer 12 via the first to fourth holes H1, H2, H3, and H4. In some embodiments, the second conductive layer CL2 may include the wire WL and the wire WL may be formed on the insulating interlayer 15 to be in direct contact with the insulating interlayer 15. The second conductive layer CL2 may be formed in a similar method used to form the aforementioned first conductive layer CL1 via a vapor deposition process and a photolithography process.

Figure 4D:
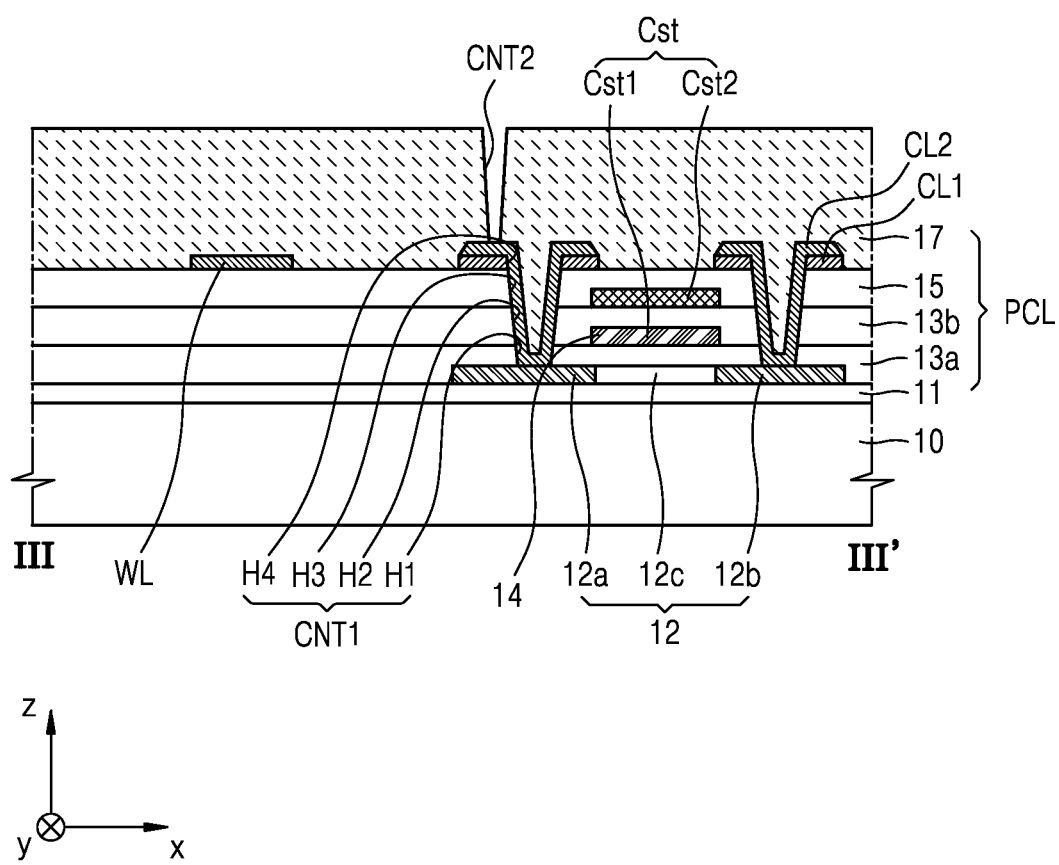

Referring to FIG. 4D, the planarization layer 17 covering the second conductive layer CL2 may be formed. The planarization layer 17 may include the second contact hole CNT2 that exposes the second conductive layer CL2. For example, a vapor deposition process and a photolithography process may be used to form the planarization layer 17.

Figure 4E:
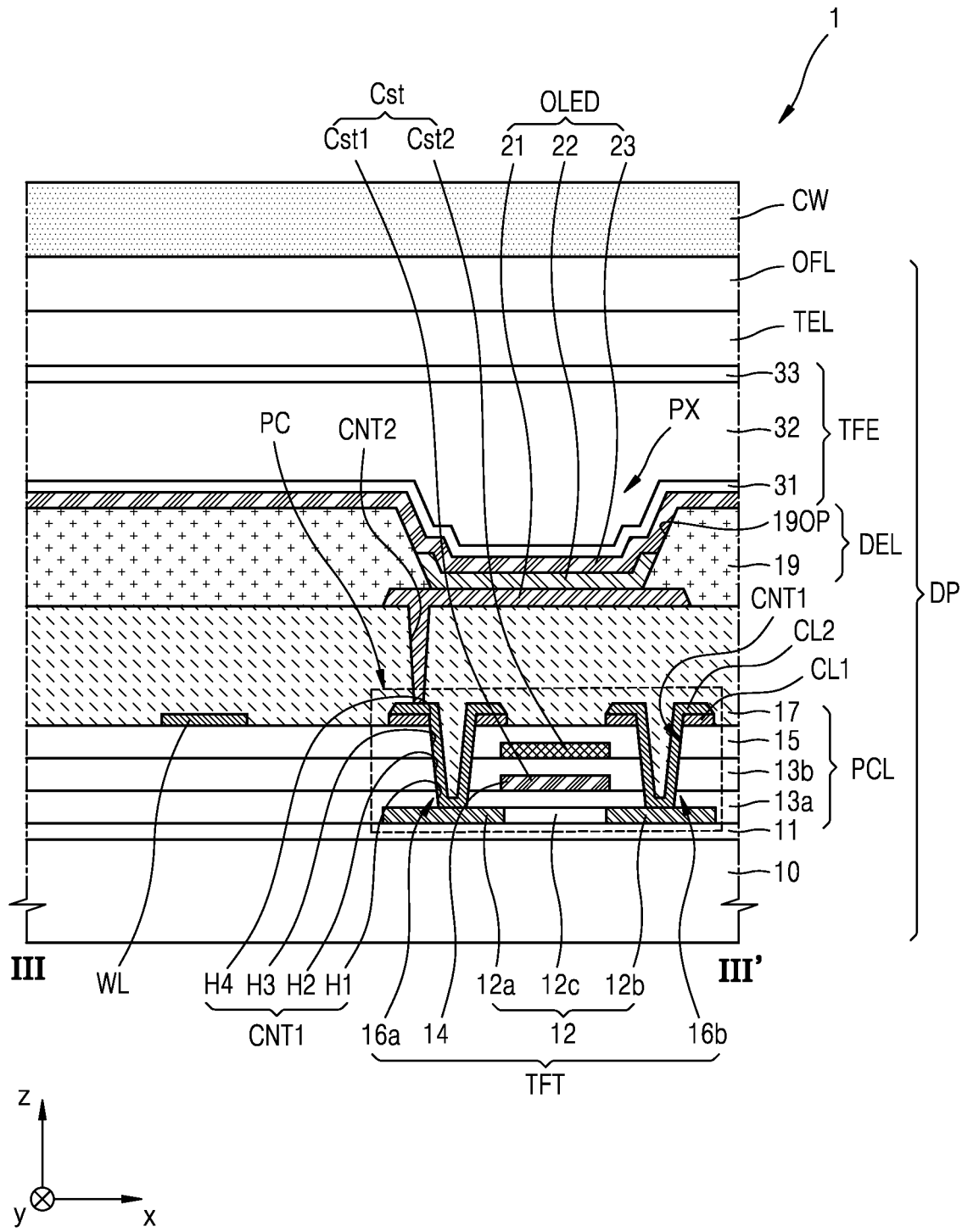

Referring to FIG. 4E, the display element layer DEL may be formed on the planarization layer 17. In detail, first, the pixel electrode 21 electrically connected to the second conductive layer CL2 may be formed. In this regard, the pixel electrode 21 is disposed on the planarization layer 17 and may be connected to the second conductive layer CL2 via the second contact hole CNT2 formed in the planarization layer 17. For example, a vapor deposition process and a photolithography process may be used to form the pixel electrode 21.

Next, the pixel-defining layer 19 disposed on the pixel electrode 21 and including the opening 190P that exposes at least part of the pixel electrode 21 may be formed. For example, a vapor deposition process and a photolithography process may be used to form the pixel-defining layer 19.

Next, the emission layer 22 disposed in the opening 190P of the pixel-defining layer 19 and corresponding to the pixel electrode 21 may be formed. For example, a vapor deposition method using a fine metal mask (FMM), inkjet printing, laser induced thermal imaging (LITI), or the like may be used to form the emission layer 22.

Next, the opposite electrode 23 disposed on the emission layer 22 may be formed. The opposite electrode 23 may be integrally formed in an entire area of the display panel DP. For example, the aforementioned vapor deposition method may be used to form the opposite electrode 23. Accordingly, the display element layer DEL may be formed.

Afterwards, the display panel DP may be manufactured by sequentially forming the thin-film encapsulation layer TFE, the touch electrode layer TEL, and the optical functional layer OFL on the display element layer DEL. The display apparatus 1 may be manufactured by attaching a cover window CW on the display panel DP.

According to an embodiment described above, without a decrease in the degree of integration or resolution, the display apparatus 1 with improved durability and impact resistance against external impact may be manufactured.

Figure 5A:
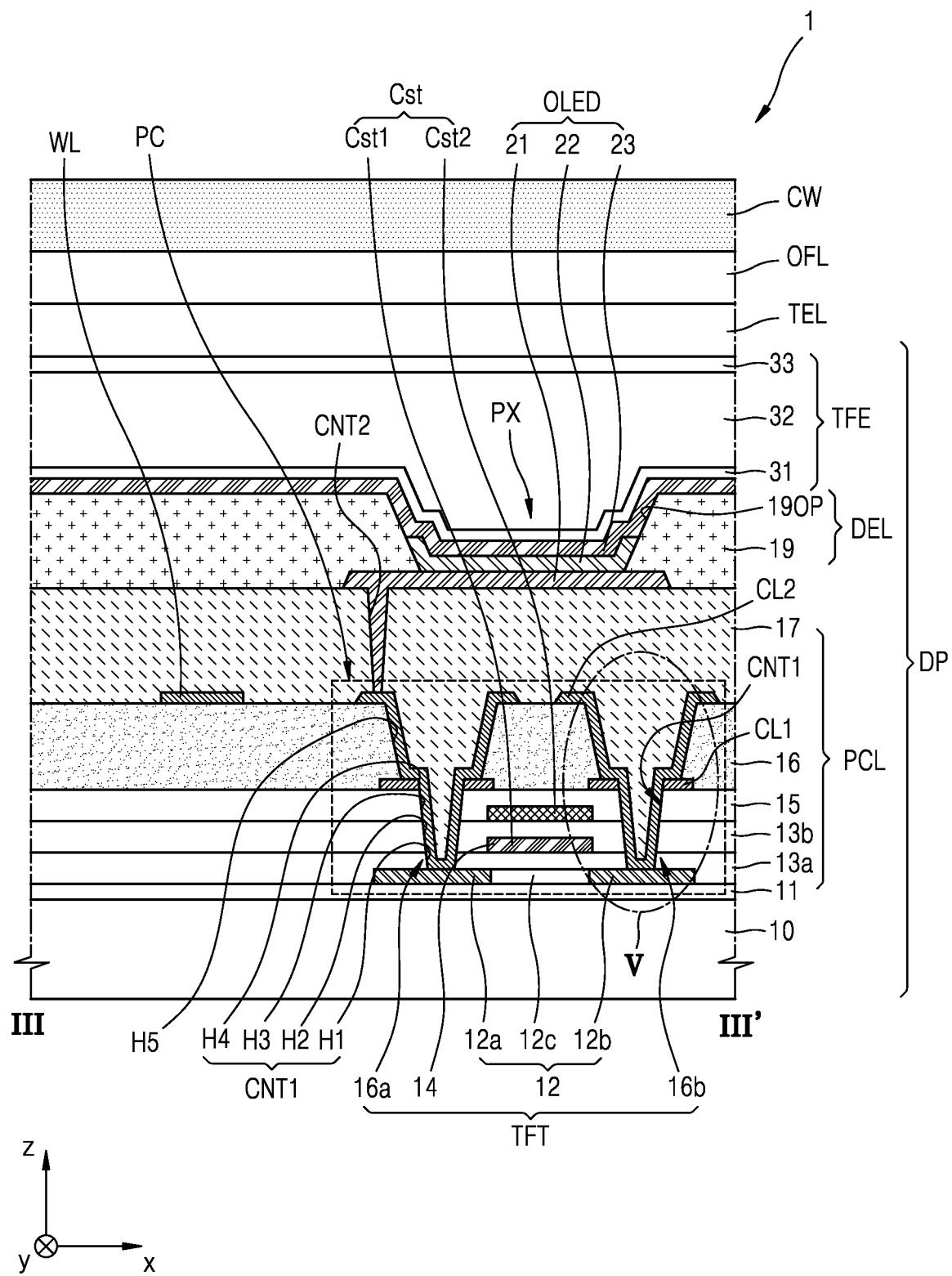
FIGS. 5A and 5B are each a schematic cross-sectional view of part of a display apparatus, according to another embodiment.
Figure 5B:
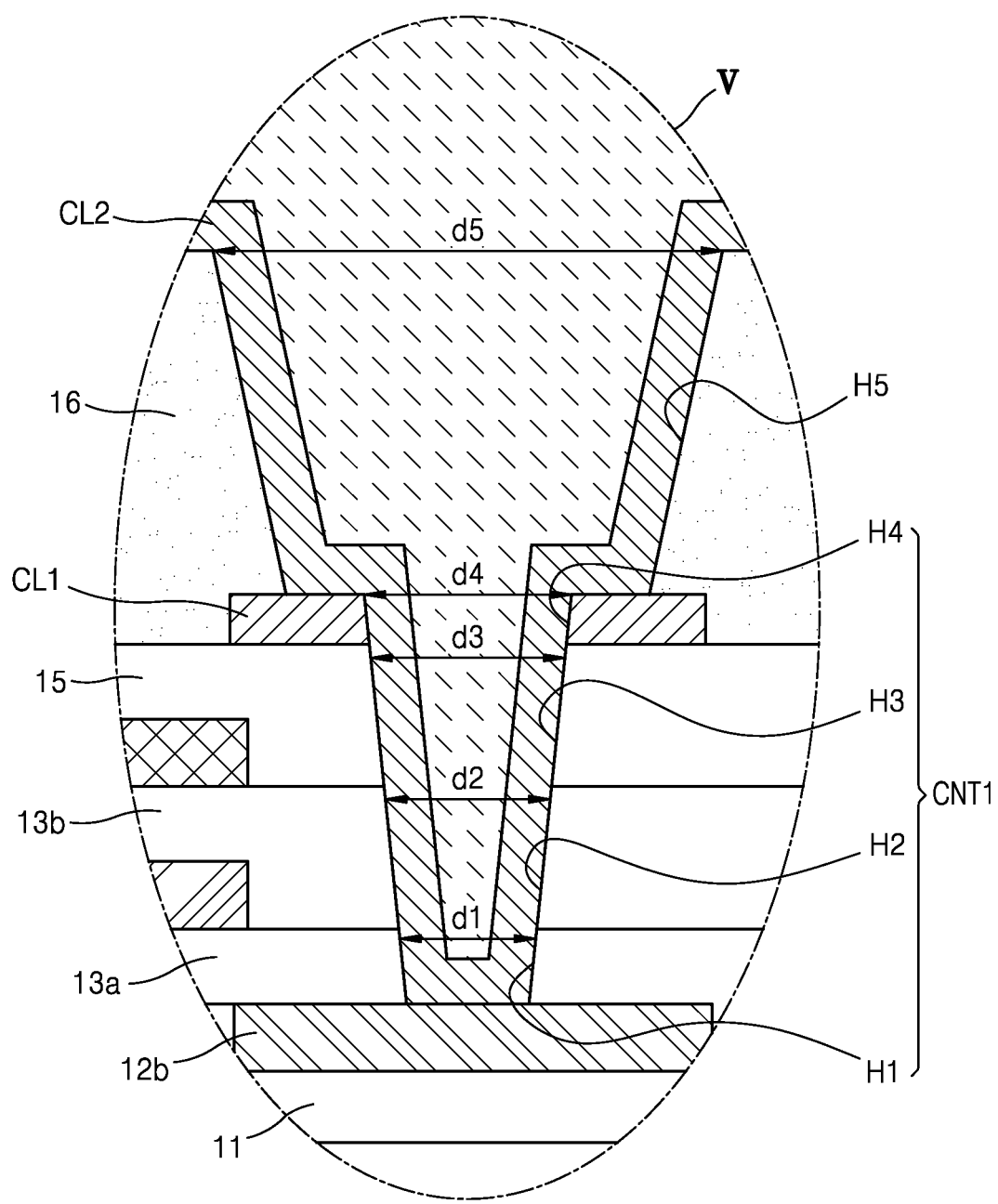

FIGS. 5A and 5B are each a schematic cross-sectional view of part of a display apparatus, according to another embodiment. FIG. 5B is an enlarged cross-sectional view of a V part of the display apparatus of FIG. 5A. The same numerals are assigned to constituent elements that are the same as or correspond to the constituent elements described with reference to FIG. 3, duplicate descriptions will be omitted, and differences will be mainly described hereinafter.

Referring to FIGS. 5A and 5B, the pixel circuit layer PCL of the display apparatus 1 may further include an organic protective layer 16 disposed between the first conductive layer CL1 and the second conductive layer CL2. The organic protective layer 16 may include an organic insulating material such as general-purpose polymer such as polymethylmethacrylate (PMMA) or polystyrene (PS), polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof.

The organic protective layer 16 may include a fifth hole H5 exposing part of the first conductive layer CL1. When viewed in a direction perpendicular to one surface of the substrate 10, for example, in a z direction, the fifth hole H5 may overlap holes of insulating layers, that is, the first hole H1 of the first gate insulating layer 13a, the second hole H2 of the second gate insulating layer 13b, and the third hole H3 of the insulating interlayer 15. In addition, the fifth hole H5 may overlap the fourth hole H4 of the first conductive layer CL1.

A width d5 of the fifth hole H5 of the organic protective layer 16 may be greater than respective widths d1, d2, and d3 of the first to third holes H1, H2, and H3. In addition, the width d5 of the fifth hole H5 of the organic protective layer 16 may be greater than a width d4 of the fourth hole H4 of the first conductive layer CL1. In this regard, a width may mean a distance between inner surfaces of a hole according to one direction parallel to one surface of the substrate 10, for example, a ±x direction. In a case where a width of a hole varies according to a thickness direction (for example, a +z direction) of the display panel DP, the width may mean a maximum width.

The fifth hole H5 of the organic protective layer 16 overlaps the fourth hole H4 of the first conductive layer CL1 so that the organic protective layer 16 covers the first conductive layer CL1, but exposes a portion of the first conductive layer CL1, and the width d5 of the fifth hole H5 may be greater than the width d4 of the fourth hole H4. The second conductive layer CL2 may be formed to correspond to the first to fifth holes H1, H2, H3, H4, and H5. The second conductive layer CL2 on the organic protective layer 16 may be formed to be in direct contact with the first conductive layer CL1 via the fifth hole H5, and may be in direct contact with a portion of the semiconductor layer 12 via the first contact hole CNT1 formed by the first to fourth holes H1, H2, H3, and H4.

In an embodiment, the wire WL may be disposed on the organic protective layer 16. The wire WL is part of the second conductive layer CL2, includes the same material as that of the second conductive layer CL2, and may be formed via the same process as used to form the second conductive layer CL2. In another embodiment, although not shown, the wire WL may be located between the organic protective layer 16 and the insulating interlayer 15. In this case, the wire WL is part of the first conductive layer CL1, includes the same material as that of the first conductive layer CL1, and may be formed via the same process as used to form the first conductive layer CL1. In another embodiment, the wire WL may be disposed both on the organic protective layer 16 and between the organic protective layer 16 and the insulating interlayer 15.

The planarization layer 17 is disposed on the organic protective layer 16 and may cover the second conductive layer CL2. The pixel electrode 21, the emission layer 22, and the opposite electrode 23 may be disposed on the planarization layer 17, as described above with reference to FIG. 3.

As a comparative example, when the organic protective layer 16 is not provided, the second conductive layer CL2 may be formed directly on the first conductive layer CL1. The first conductive layer CL1 may include a metal material, and when a second conductive layer material is formed directly on the first conductive layer CL1 by a vapor deposition method such as sputtering, an arc may occur. As an exposed area of the first conductive layer CL1 increases in a sputtering process, more arcs may occur.

According to an embodiment, the organic protective layer 16 covers the first conductive layer CL1, but exposes only a portion of the first conductive layer CL1. Accordingly, when the second conductive layer material is formed by a vapor deposition method such as sputtering to form the second conductive layer CL2, occurrence of arcs may be minimized.

Furthermore, the organic protective layer 16 may absorb external impact, for example, external impact transmitted from the cover window CW to the display panel DP, and thus, may function to protect insulating layers under the organic protective layer 16, that is, the first gate insulating layer 13a, the second gate insulating layer 13b, and the insulating interlayer 15. Accordingly, the organic protective layer 16 reduces a possibility of occurrence of damage such as a crack or the like in the insulating layers of the display panel DP.

FIGS. 6A to 6F are schematic cross-sectional views showing a method of manufacturing a display apparatus according to another embodiment. Descriptions that are redundant with those described above with reference to FIGS. 4A to 4E will be omitted and differences will be mainly described.

Figure 6A:
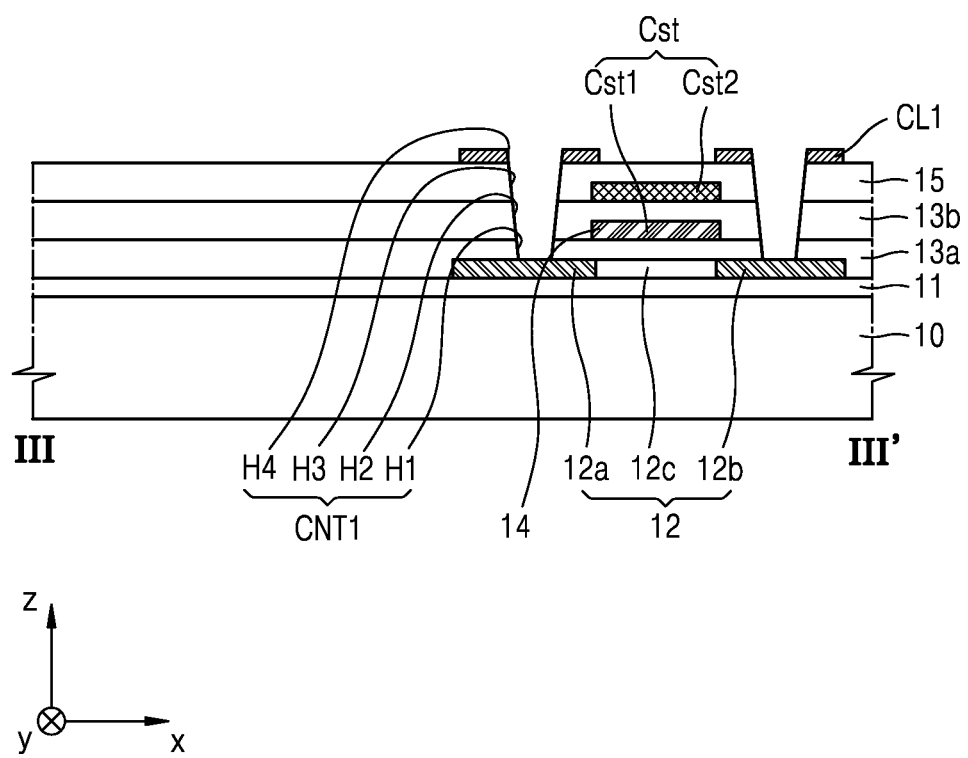
FIGS. 6A, 6B, 6C, 6D, 6E and 6F are schematic cross-sectional views showing a method of manufacturing a display apparatus, according to another embodiment.

Referring to FIG. 6A, the buffer layer 11, the semiconductor layer 12, the first gate insulating layer 13a, the gate electrode 14, the second gate insulating layer 13b, the upper electrode Cst2 of the storage capacitor Cst, the insulating interlayer 15, and the first conductive layer CL1 may be sequentially formed on the substrate 10. Because methods of forming those described above are the same as described with reference to FIGS. 4A and 4B above, redundant descriptions will be omitted.

Figure 6B:
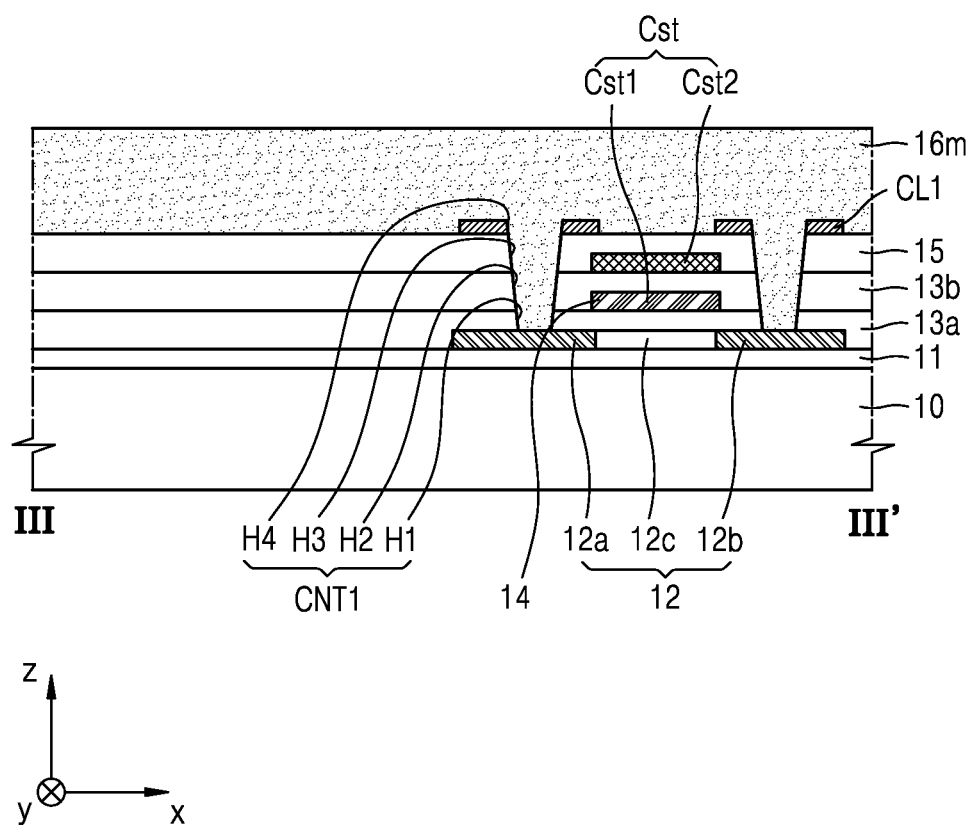
Figure 6C:
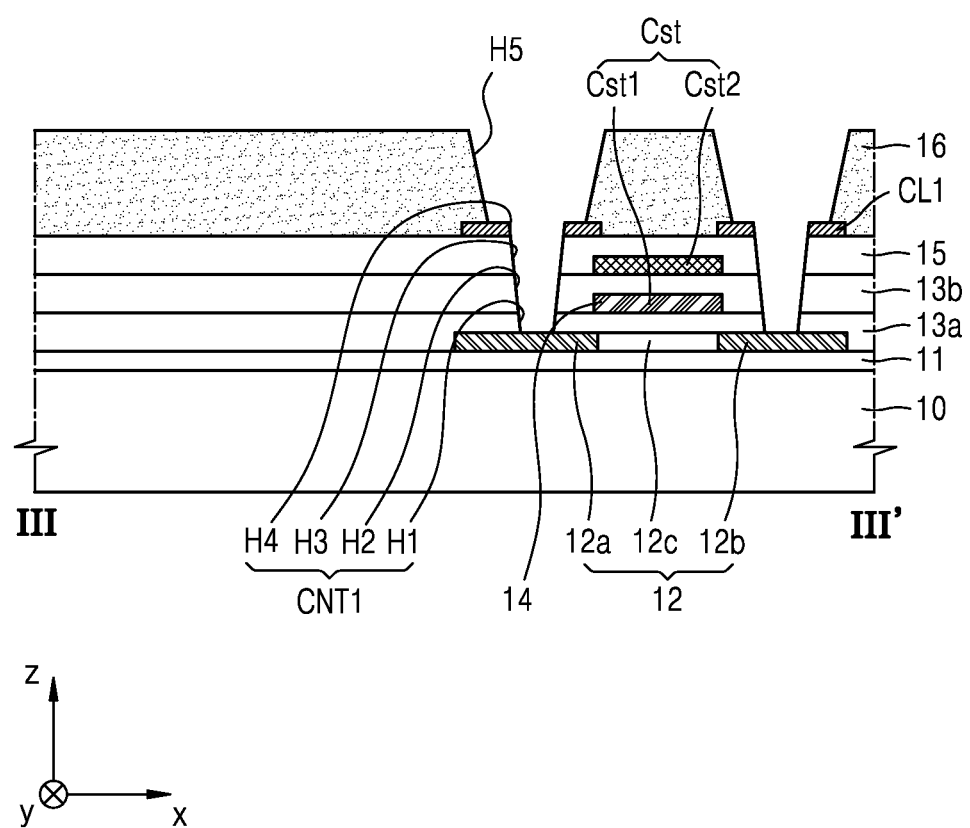

Referring to FIGS. 6B and 6C, prior to forming the second conductive layer CL2, the organic protective layer 16 may be formed on the first conductive layer CL1. In detail, as shown in FIG. 6B, first, an organic protective layer material 16m may be entirely formed on the first conductive layer CL1. The organic protective layer material 16m may be coated on the insulating interlayer 15 on which the first conductive layer CL1 is disposed by using a photoresist. Alternatively, the aforementioned vapor deposition method may be used to form the inorganic protective layer material 16m on the insulating interlayer 15 on which the first conductive layer CL1 is disposed.

Next, as shown in FIG. 6C, the fifth hole H5 may be formed. The fifth hole H5 may be formed by exposing and developing the organic protective layer material 16m or by patterning the inorganic protective layer material 16m using a photolithographic process. As described above, the fifth hole H5 may overlap the first to fourth holes H1, H2, H3, and H4, and the width d5 (see FIG. 5B) of the fifth hole H5 may be greater than the respective widths d1, d2, d3, and d4 (see FIG. 5B) of the first to fourth holes H1, H2, H3, and H4. Accordingly, the fifth hole H5 may expose a portion of the first conductive layer CL1.

Figure 6D:
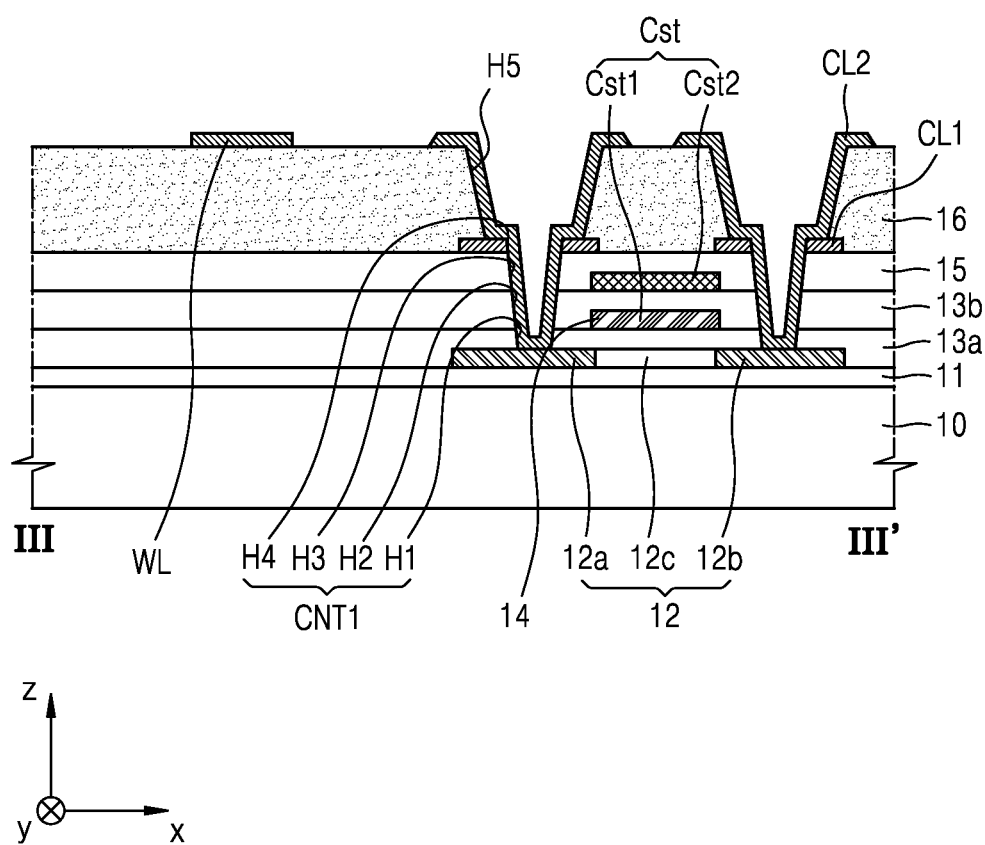

Referring to FIG. 6D, the second conductive layer CL2 may be formed on the protective layer 16 which is an organic protective layer or an inorganic protective layer. The second conductive layer CL2 may be formed to overlap the first to fifth holes H1, H2, H3, H4, and H5. Accordingly, the second conductive layer CL2 may be in direct contact with portions of the first conductive layer CL1 and the semiconductor layer 12 via the fifth hole H5 and the first contact hole CNT1 formed by the first to fourth holes H1, H2, H3, and H4. The second conductive layer CL2 may be formed in a similar method used to form the aforementioned first conductive layer CL1 via a vapor deposition process and a photolithography process.

Figure 6E:
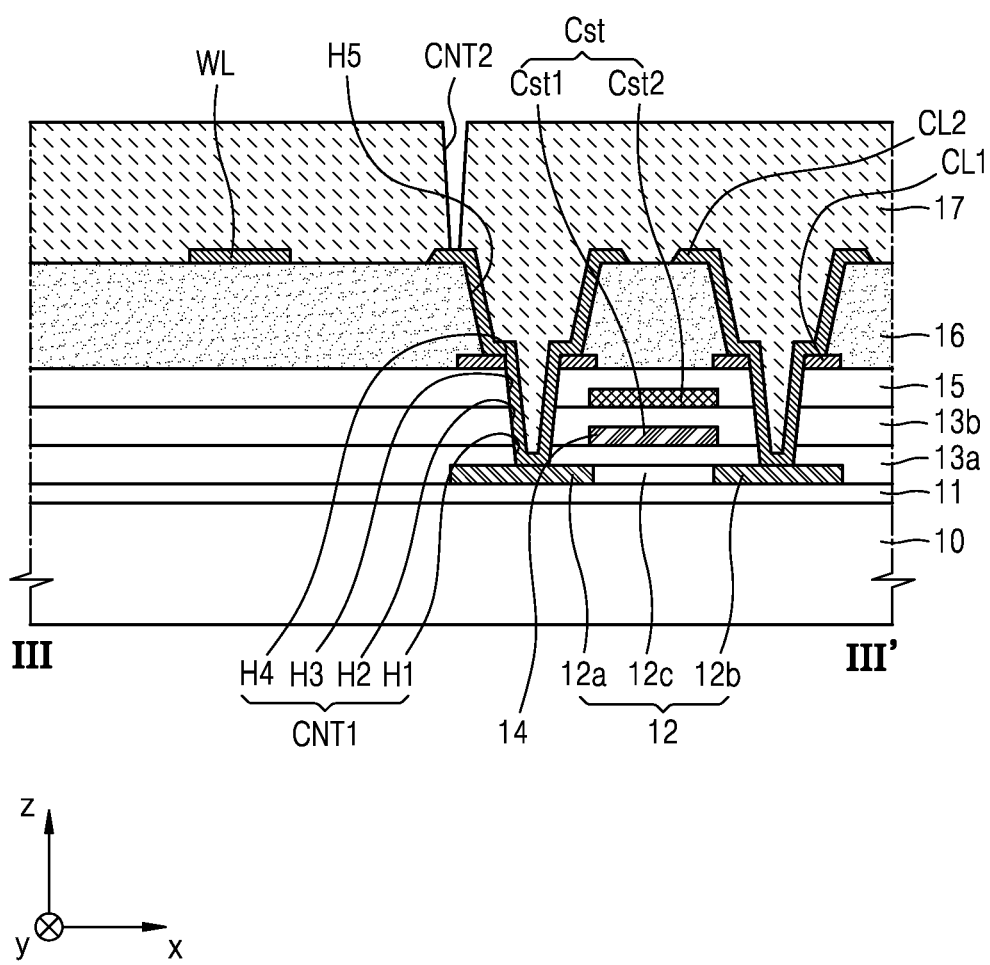

Referring to FIG. 6E, the planarization layer 17 covering the second conductive layer CL2 may be formed. The planarization layer 17 may include the second contact hole CNT2 exposing part of the second conductive layer CL2. For example, the planarization layer 17 may be formed via a vapor deposition process and a photolithography process.

Figure 6F:
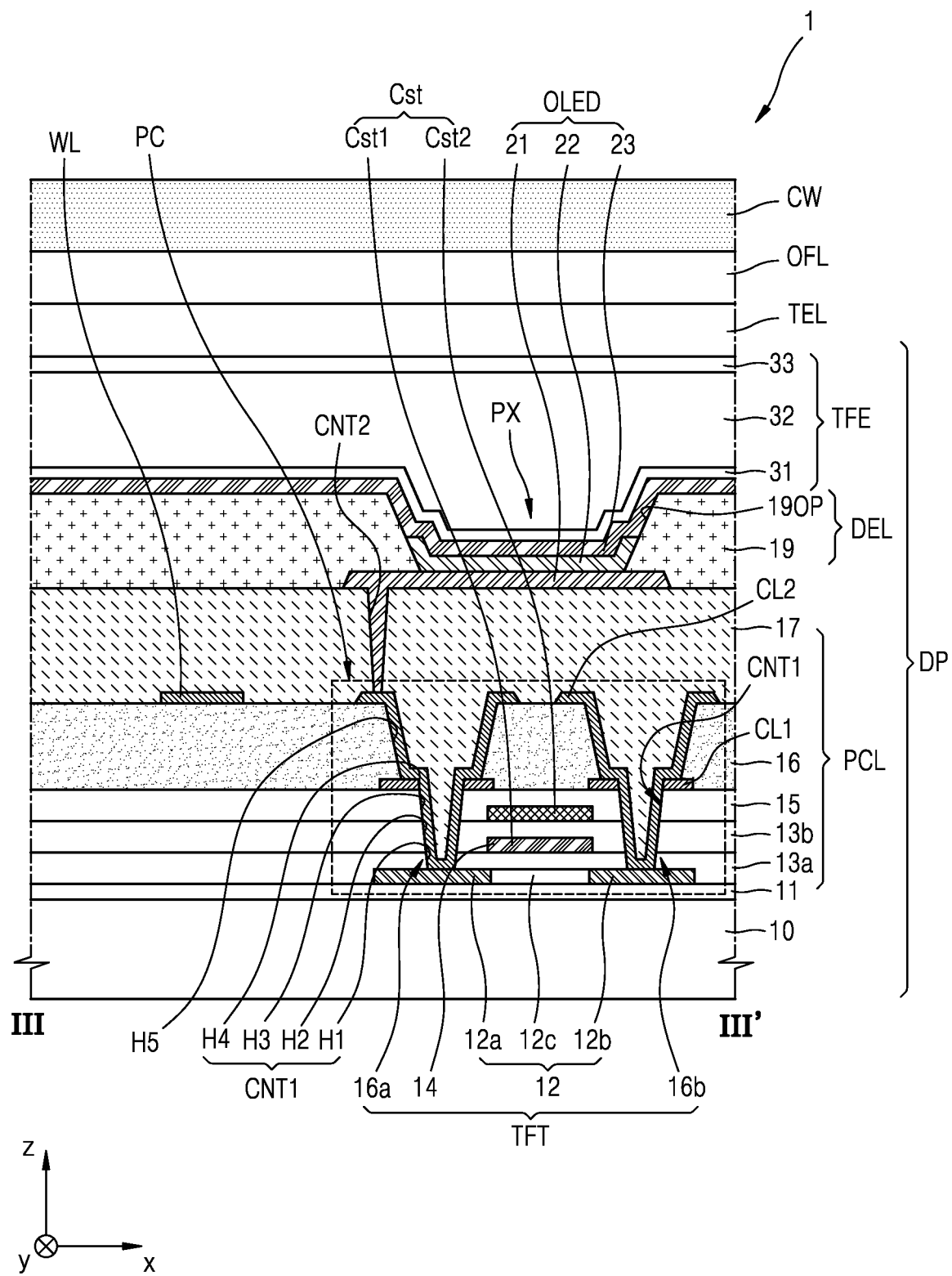

Referring to FIG. 6F, the display panel DP may be manufactured by forming the display element layer DEL, the thin-film encapsulation layer TFE, the touch electrode layer TEL, and the optical functional layer OFL on the planarization layer 17. The display apparatus 1 may be manufactured by attaching a cover window CW on the display panel DP.

According to an embodiment described above, without a decrease in the degree of integration or resolution, the display apparatus 1 with improved durability and impact resistance against external impact may be manufactured. In addition, provided is a method of manufacturing the display apparatus 1, the method that has minimized occurrence of arcs during a vapor deposition process using sputtering or the like.

According to an embodiment of the disclosure as described above, durability and impact resistance of a display apparatus may be improved. In addition, a method of manufacturing such display apparatus is provided, but a method of manufacturing a display apparatus in which a design margin is reduced by minimizing a mis-alignment between overlapping holes while maintaining the degree of integration may be implemented. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
 a substrate;
 a semiconductor layer disposed on the substrate;
 an insulating layer covering the semiconductor layer and including a first hole exposing a portion of the semiconductor layer;
 a first conductive layer disposed on the insulating layer and including a second hole overlapping the first hole in a plan view; and
 a second conductive layer in contact with the portion of the semiconductor layer via the first hole and the second hole.

2. The display apparatus of claim 1, further comprising:
 a planarization layer covering the second conductive layer;
 a pixel electrode disposed on the planarization layer and electrically connected to a portion of the second conductive layer;
 an opposite electrode overlapping the pixel electrode; and
 an emission layer disposed between the pixel electrode and the opposite electrode.

3. The display apparatus of claim 2, wherein the planarization layer comprises an organic insulating material.

4. The display apparatus of claim 1, wherein the first conductive layer is in direct contact with the second conductive layer.

5. The display apparatus of claim 1, wherein the semiconductor layer comprises a channel area, a drain area, and a source area, and
 wherein the second conductive layer contacts the drain area or the source area.

6. The display apparatus of claim 1, further comprising a wire disposed on the insulating layer and including a same material as the second conductive layer.

7. The display apparatus of claim 1, wherein the insulating layer comprises an inorganic insulating material.

8. The display apparatus of claim 1, further comprising an organic protective layer disposed between the first conductive layer and the second conductive layer.

9. The display apparatus of claim 8, wherein the organic protective layer comprises a third hole exposing part of the first conductive layer.

10. The display apparatus of claim 9, wherein the third hole of the organic protective layer overlaps the first hole of the insulating layer.

11. The display apparatus of claim 9, wherein a width of the third hole of the organic protective layer is greater than a width of the first hole of the insulating layer.

12. The display apparatus of claim 9, wherein the second conductive layer is in direct contact with the first conductive layer via the third hole.

13. The display apparatus of claim 8, further comprising:
 a planarization layer disposed on the organic protective layer and covering the second conductive layer;
 a pixel electrode disposed on the planarization layer and electrically connected to a portion of the second conductive layer;
 an opposite electrode overlapping the pixel electrode; and
 an emission layer disposed between the pixel electrode and the opposite electrode.

* * * * *